United States Patent
Mendel

(10) Patent No.: US 6,320,411 B1
(45) Date of Patent: Nov. 20, 2001

(54) PROGRAMMABLE LOGIC ARRAY DEVICES WITH ENHANCED INTERCONNECTIVITY BETWEEN ADJACENT LOGIC REGIONS

(75) Inventor: David W. Mendel, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/443,969

(22) Filed: Nov. 19, 1999

Related U.S. Application Data

(62) Division of application No. 08/924,768, filed on Aug. 27, 1997, now Pat. No. 6,184,710
(60) Provisional application No. 60/041,423, filed on Mar. 20, 1997.

(51) Int. Cl.[7] .................................................. H03K 19/177
(52) U.S. Cl. .................................. 326/41; 326/40; 326/38
(58) Field of Search ........................................... 326/37–41

(56) References Cited

U.S. PATENT DOCUMENTS

| | | |
|---|---|---|
| Re. 34,363 | 8/1993 | Freeman . |
| 3,473,160 | 10/1969 | Wahlstrom . |
| 4,609,986 | 9/1986 | Hartmann et al. . |
| 4,617,479 | 10/1986 | Hartmann et al. . |
| 4,642,487 | 2/1987 | Carter . |
| 4,677,318 | 6/1987 | Veenstra . |
| 4,713,792 | 12/1987 | Hartmann et al. . |
| 4,758,745 | 7/1988 | Elgamal et al. . |
| 4,774,421 | 9/1988 | Hartmann et al. . |
| 4,847,612 | 7/1989 | Kaplinsky . |
| 4,871,930 | 10/1989 | Wong et al. . |
| 4,899,067 | 2/1990 | So et al. . |
| 4,912,342 | 3/1990 | Wong et al. . |
| 4,931,671 | * 6/1990 | Agrawal ................................. 326/41 |
| 5,023,606 | 6/1991 | Kaplinsky . |
| 5,073,729 | 12/1991 | Greene et al. . |
| 5,121,006 | 6/1992 | Pedersen . |

(List continued on next page.)

FOREIGN PATENT DOCUMENTS

| | | | |
|---|---|---|---|
| 463746 A2 | 1/1992 | (EP) | ................................ G06F/15/60 |
| 630115 A2 | 12/1994 | (EP) | ............................. H03K/19/177 |
| WO 95/04404 | 2/1995 | (WO) | ............................ H03K/19/177 |
| WO 95/22205 | 8/1995 | (WO) | ............................ H03K/19/177 |

OTHER PUBLICATIONS

"Data Book," Altera Corporation, San Jose, CA, Jun. 1996.

R. C. Minnick, "A Survey of Microcellular Research," Journal of the Association for Computing Machinery, vol. 14, No. 2, pp. 203–241, Apr. 1967.

S. E. Wahlstrom, "Programmable Logic Arrays—Cheaper by the Millions," Electronics, Dec. 11, 1967, pp. 90–95.

(List continued on next page.)

*Primary Examiner*—Michael Tokar
*Assistant Examiner*—Don Phu Le
(74) *Attorney, Agent, or Firm*—Fish & Neave; Robert R. Jackson; Joo-Youn Park

(57) ABSTRACT

A programmable logic device has plural regions of programmable logic and a general-purpose interconnection network for conveying signals to, from, and between the regions. In addition to the general-purpose interconnection network, more direct interconnections are provided from outputs of each region to inputs of one or more other adjacent or nearby regions. At least some of these direct interconnections are preferably multiplexed with more conventional inputs to the other regions so that the input resources required for each region do not become excessive. The invention is particularly useful for devices which perform basic logic using sum-of-products ("Pterm") logic. However, the invention is also useful in other types of devices such as those which perform basic logic using look-up tables.

17 Claims, 11 Drawing Sheets

U.S. PATENT DOCUMENTS

| | | |
|---|---|---|
| 5,122,685 | 6/1992 | Chan et al. . |
| 5,132,571 | 7/1992 | McCollum et al. . |
| 5,144,166 | 9/1992 | Camarota et al. . |
| 5,208,491 | 5/1993 | Ebeling et al. . |
| 5,218,240 | 6/1993 | Camarota et al. . |
| 5,220,214 | 6/1993 | Pedersen . |
| 5,225,719 | 7/1993 | Agrawal et al. . |
| 5,241,224 | 8/1993 | Pedersen et al. . |
| 5,255,203 | 10/1993 | Agrawal et al. . |
| 5,258,668 | 11/1993 | Cliff et al. . |
| 5,260,610 | 11/1993 | Pedersen et al. . |
| 5,260,611 | 11/1993 | Cliff et al. . |
| 5,274,581 | 12/1993 | Cliff et al. . |
| 5,338,984 | 8/1994 | Sutherland . |
| 5,349,250 | 9/1994 | New ........................ 326/39 |
| 5,350,954 | 9/1994 | Patel . |
| 5,371,422 | 12/1994 | Patel et al. ............................ 326/41 |
| 5,448,186 | 9/1995 | Kawata ................... 326/41 |
| 5,455,525 | 10/1995 | Ho et al. ............... 326/41 |
| 5,467,029 | 11/1995 | Taffe et al. ............................ 326/41 |
| 5,469,003 | 11/1995 | Kean ....................... 326/39 |
| 5,483,178 | 1/1996 | Costello et al. ....................... 326/41 |
| 5,509,128 | 4/1996 | Chan ................... 395/311 |
| 5,557,217 * | 9/1996 | Pedersen ............................. 326/41 |
| 5,672,985 | 9/1997 | Lee ........................ 326/41 |
| 5,689,195 | 11/1997 | Cliff et al. ............................ 326/41 |
| 5,781,032 | 7/1998 | Bertolet et al. ....................... 326/41 |
| 5,909,126 | 6/1999 | Cliff et al. ............................. 326/41 |
| 5,977,793 | 11/1999 | Reddy et al. .......................... 326/41 |
| 5,999,016 | 12/1999 | McClintock et al. ................... 326/41 |

OTHER PUBLICATIONS

*Recent Developments in Switching Theory*, A. Mukhopadhyay, ed., Academic Press, New York, 1971, chapters VI and IX, pp. 229–254 and 369–422.

*The Programmable Gate Array Data Book*, 1988, Xilinx, Inc., San Jose, CA.

El Gamal et al., "An Architecture for Electrically Configurable Gate Arrays," IEEE Journal of Solid–State Circuits, vol. 24, No. 2, Apr. 1989, pp. 394–398.

El–Ayat et al., "A CMOS Electrically Configurable Gate Array," IEEE Journal of Solid–State Circuits, vol. 24, No. 3, June 1989, pp. 752–762.

*ACT Family Field Programmable Gate Array Databook*, Apr. 1992, Actel Corporation, Sunnyvale, CA, pp. 1–35 through 1–44.

*The Programmable Logic Data Book*, 1994, Xilinx, Inc., San Jose, CA, pp. 2–7, 2–12, and 2–13.

"XC5000 Logic Cell Array Family, Technical Data, Advance Information," Xilinx, Inc., Feb. 1995.

* cited by examiner

PROGRAMMABLE LOGIC ARRAY DEVICES WITH ENHANCED INTERCONNECTIVITY BETWEEN ADJACENT LOGIC REGIONS

CROSS REFERENCE TO RELATED APPLICATION

This application claims the benefit of U.S. provisional patent application No. 60/041,423, filed Mar. 20, 1997. This application is also a division of application No. 08/924,768, filed Aug. 27, 1997, now U.S. Pat. No. 6,184,710, which is hereby incorporated by reference herein in its entirety.

BACKGROUND OF THE INVENTION

This invention relates to programmable logic array integrated circuit devices, and more particularly to the interconnection conductor resources provided on such devices.

Programmable logic devices which perform combinatorial logic functions based on product term ("Pterm") logic are well known as is shown, for example, by Pedersen et al. U.S. Pat. No. 5,241,224 and Patel et al. U.S. Pat. No. 5,371,422. Programmable logic devices which perform combinatorial logic functions based on look-up table logic are also well known as is shown, for example, by Cliff et al. U.S. Pat. No. 5,909,126. All of these references are hereby incorporated by reference herein.

The above-mentioned Cliff et al. reference shows a programmable logic device architecture in which so-called subregions of programmable logic are grouped together in so-called regions of programmable logic. Although other implementations are possible, in the especially preferred embodiment shown by Cliff et al. each subregion includes (1) a four-input look-up table for performing combinatorial logic on as many as four inputs to the subregion, (2) a register, and (3) programmable logic connectors ("PLCs") for allowing the subregion to output the look-up table output either directly or as registered by the register. The Cliff et al. subregions may also have other capabilities, but the foregoing simplified description will be sufficient for present purposes.

An advantageous feature of the Cliff et al. architecture is that local interconnection conductors are interspersed or interleaved between adjacent regions. These local conductors bring signals to the adjacent regions from other longer-distance interconnection conductors such as those that extend along an entire row or column of regions on the device. The local conductors also receive the output signals of the adjacent regions and convey those signals to the longer-distance conductors. Each subregion in a region receives some of its inputs from the local conductors on each side of the region that includes that subregion. Thus each subregion can receive as an input via the adjacent local conductors the output of any subregion in the region that includes that subregion and any subregion in either of the regions that share local conductors with the region that includes that subregion. To illustrate the last portion of the preceding sentence, a subregion in a first region can output to a local conductor that is interleaved between the first region and an adjacent second region. A subregion in the second region can derive one of its inputs from that local conductor. Data can thereby travel very rapidly between adjacent regions using local conductors interleaved between those regions and without having to make use of the inherently somewhat slower longer-distance conductors.

The above-described advantage of look-up table based programmable logic devices with interleaved local conductors does not generalize very well to Pterm based devices. This is because in Pterm logic the input signals do not divide among the various macrocells very completely. Many input signals may be required to feed large numbers of Pterms.

In view of the foregoing, it is an object of this invention to provide Pterm logic with local interconnections between logic regions comparable to the local interconnections that are provided by the local conductors that are interleaved between the logic regions in devices of the type shown in the above-mentioned Cliff et al. reference.

It is a more general object of this invention to provide improved architectures for programmable logic devices, especially those that employ Pterm logic, but in some cases also those employing other types of logic such as look-up tables.

SUMMARY OF THE INVENTION

These and other objects of the invention are accomplished in accordance with the principles of the invention by providing programmable logic devices having plural regions of programmable Pterm logic and a network of general-purpose inter-region interconnection conductors that is usable to convey signals to, from, and between the regions. Each region has an associated programmable interconnect array ("PIA") which is programmable to select signals from the general-purpose interconnection conductor network for application to the programmable AND array of the region. The AND array of each region is programmable to produce various Pterms from its inputs. Some of the Pterms in each region are grouped into plural macrocells including several Pterms each. Other Pterms in each region may be used separately as so-called expander Pterms. Each macrocell also typically includes (1) an OR gate for logically combining at least some of the Pterms of the macrocell (to produce a sum-of-products output), (2) a register, and (3) a PLC (e.g., a switch or multiplexer) for allowing the macrocell to output the OR gate output either directly or as registered by the register. The macrocell outputs are connected to the general-purpose interconnection conductor network. The expander Pterms are fed back into the AND array producing those Pterms.

In order to provide the kind of more direct interconnections between adjacent regions that are provided by the interleaved local conductors in the above-mentioned Cliff et al. reference, at least some of the outputs of each region may be multiplexed with PIA outputs of one or more adjacent regions. The region outputs that are thus multiplexed onto the inputs of an adjacent region or regions may be some or all of the macrocell outputs of the first region, some or all of the expander Pterms of the first region, or some or all of both the macrocell outputs and expander Pterms of the first region.

An "adjacent" region in this discussion does not have to be an immediately adjacent region. Instead, it could be spaced some distance away, such as immediately adjacent to an immediately adjacent region.

With the foregoing definition of "adjacent" in mind, certain principles of this invention can also be applied to non-Pterm-type programmable logic devices such as look-up table devices of the type that are the main focus of the above-mentioned Cliff et al. reference. In such devices the outputs of a region can be multiplexed with local conductor inputs that are interleaved between two other nearby regions to make it possible to make direct connections between the first region and these two other regions.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
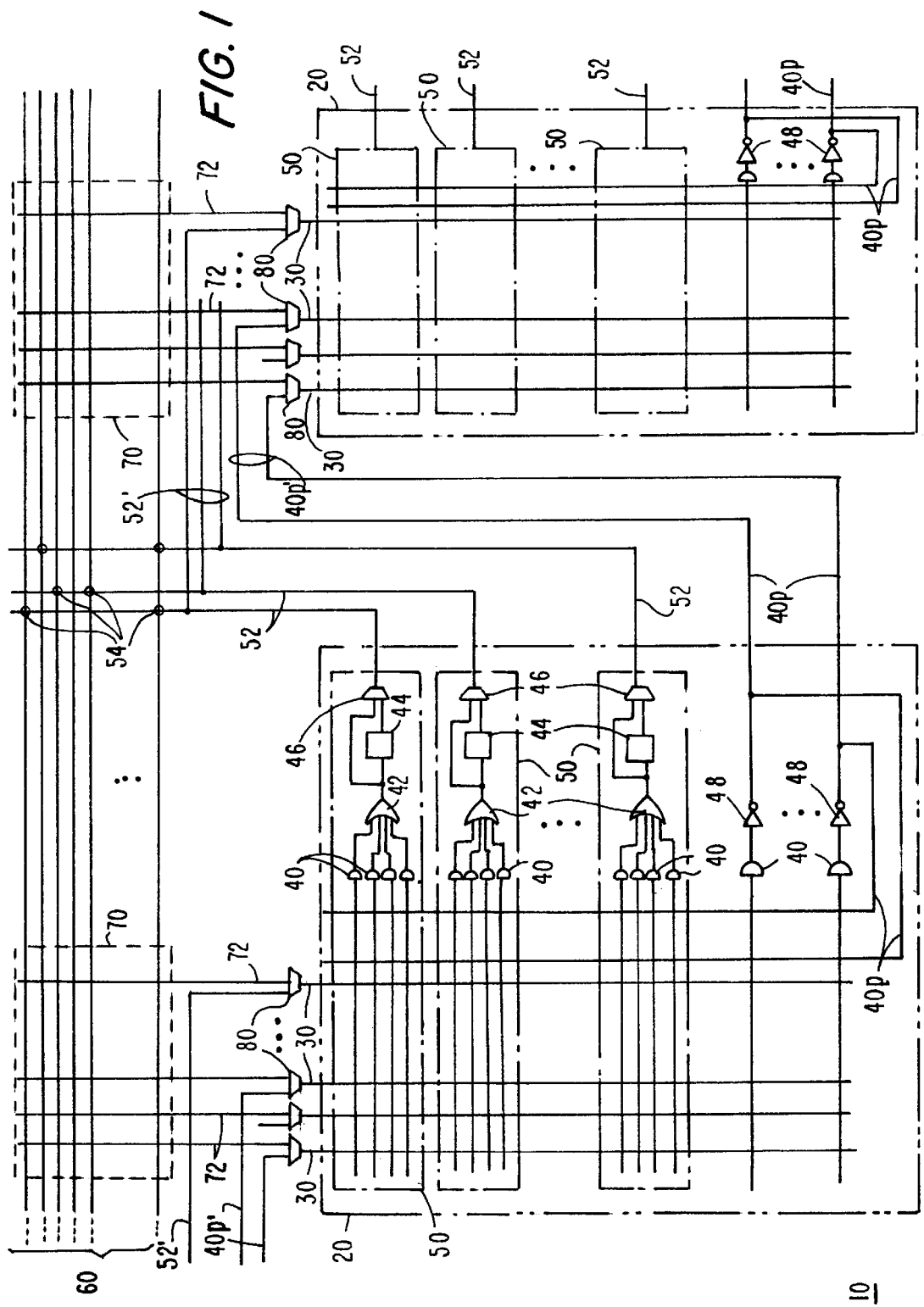
FIG. 1 is a simplified schematic block diagram of a representative portion of an illustrative embodiment of a Pterm-based programmable logic device constructed in accordance with the invention.

The illustrative programmable logic device 10 shown in representative part in FIG. 1 includes a plurality of regions 20 of programmable logic. For example, regions 20 may be disposed on device 10 in a plurality of intersecting rows and columns of regions (see also FIG. 10). Thus FIG. 1 shows two adjacent regions 20 in one representative row; and the two regions 20 shown in FIG. 1 are also one region in each of two adjacent columns of regions.

Each region 20 has a plurality of inputs 30 feeding a programmable AND array shown toward the left in each of the depicted regions. Inputs 30 are sometimes called word lines. Although not shown in FIG. 1, each input 30 may be fed into the AND array in both true and complement form. Also feeding the AND array of each region are a plurality of expander Pterms 40p produced by the AND array as described in more detail below.

The AND array in each region 20 is programmable to produce a plurality of Pterm output signals 40. Small AND gate symbols are associated with representative ones of these Pterm outputs, and for convenience the reference number 40 is applied to these AND gate symbols. Some of the Pterms 40 in each region are grouped in a plurality of groups associated with so-called macrocells of the region. For example, FIG. 1 shows three representative macrocells 50 in each region 20. At least some of the Pterms associated with each macrocell are logically combined by an OR gate 42 in the macrocell to produce a sum-of-products signal. Each macrocell 50 may also include a register 44 for registering the output signal of that macrocell's OR gate 42. Each macrocell 50 may further include a PLC 46 for allowing the macrocell to output as a final macrocell output signal 52 either the OR gate output signal or the register output signal.

Other Pterms 40 in each region 20 are not architecturally associated with particular macrocells 50. Representative ones of these so-called expander Pterms are shown toward the bottom of each region 20 in FIG. 1. Each expander Pterm 40 is inverted by an associated inverting driver 48 and fed back into the originating AND array as a Pterm signal 40p. Expander Pterms 40p are usable in the originating region to help fulfill any need for logic functions with larger fan-in (i.e., more Pterms) than are architecturally associated with any one macrocell 50.

In an illustrative embodiment each region 20 has 33 inputs 30, 16 macrocells 50, and 16 expander Pterms 40p.

It will be understood that the construction of regions 20 shown in FIG. 1 and described above is only illustrative, and that many variations on this construction are possible and well known to those skilled in the art. For example, each macrocell 50 may include an EXCLUSIVE OR gate downstream from the OR gate 42 for selectively inverting the output of the OR gate under the control of another Pterm 40 (see, for example, Pedersen U.S. Pat. No. 5,121,006). As another example, some or all of Pterms 40 may be switchable among two or more OR gates 42 for such purposes as allowing variation in the numbers of Pterms feeding the various OR gates. As still another example, the output of each OR gate 42 may be selectively connectable to one input of one or more adjacent OR gates 42, again for such purposes as facilitating the provision of wider fan-in functions (see again, for example, Pedersen U.S. Pat, No. 5,121, 006). Many other enhancements of the relatively rudimentary region 20 construction shown in FIG. 1 are known and can be used in the devices of this invention. However, because the exact construction of regions 20 is immaterial to the basic principles of this invention, the relatively simple illustrative region structure shown in FIG. 1 will be sufficient as a starting point for the discussion of the invention.

In order to convey signals to, from, and between regions 20 a network of general-purpose interconnection conductors 60 is provided on device 10. For example, network 60 may include pluralities of conductors that extend along each row of regions 20 and other conductors that extend along each column of regions 20 (see also FIG. 10). A programmable interconnect array ("PIA") 70 (made up of PLCs) is associated with each region 20 for selectively connecting conductors 60 to region-feeding conductors 72. The macrocell outputs 52 of each region 20 are each selectively connectable to any of at least several of the adjacent conductors 60 by PLCs 54. Network 60 generally allows any macrocell output 52 on device 10 to be supplied as an input 30 to any region 20 on the device. Network 60 is also usable to distribute signals applied to input pins of device 10 throughout the device, and to apply macrocell outputs 52 to output pins of the device (see again FIG. 10, wherein input and output pins are collectively identified by reference number 210). Each PIA 70 may be fully populated or only partially populated with PLC interconnections between each associated conductor 60 and each associated conductor 72. If each PIA 70 is only partially populated, then each PIA 70 preferably provides several ways for the signal on each associated conductor 60 to get into the associated region 20.

In order to provide more direct connections between adjacent regions 20 in accordance with the present invention, a PLC 80 is provided in the circuit path between each of at least some of region-feeding conductors 72 and the associated AND array input 30. Each PLC 80 has two inputs, and (in illustrative embodiments in which each PLC 80 is implemented as a switch or multiplexer) each such PLC 80 is programmable to select the signal on one of those two inputs as its output. The other input to each PLC 80 associated with a region 20 is a respective one of the outputs 52 or 40p of another adjacent region 20. Accordingly, each of these outputs 52 or 40p of one region 20 can be applied substantially directly to an input 30 of another adjacent region 20 in lieu of the PIA output signal 72 that would normally be applied to that input 30. For ease of reference the branches of conductors 52 and 40p that cooperate with PLCs 80 to provide the above-described more direct inter-region interconnections are identified by reference numbers 52' and 40p', respectively.

The direct connection structure described above has a number of important advantages. One of these advantages is faster connections between adjacent regions 20. Direct connections 52' and 40p' tend to be significantly faster than longer and more heavily loaded general-purpose interconnection conductors 60. Another advantage of the above-described direct connection structure is greater use of shareable expander Pterms 40p. This advantage is due to the fact that it is now possible for each region 20 to use the expander Pterms 40p from an adjacent region 20. Still another advantage of the above-described structure is more flexible use of the PIA lines 72. If a region 20 needs more inputs than it has PIA lines 72, some of those inputs can be steered to the neighboring region 20 and routed through that region's expander Pterms 40p to the region requiring a greater number of inputs.

Figure 2:
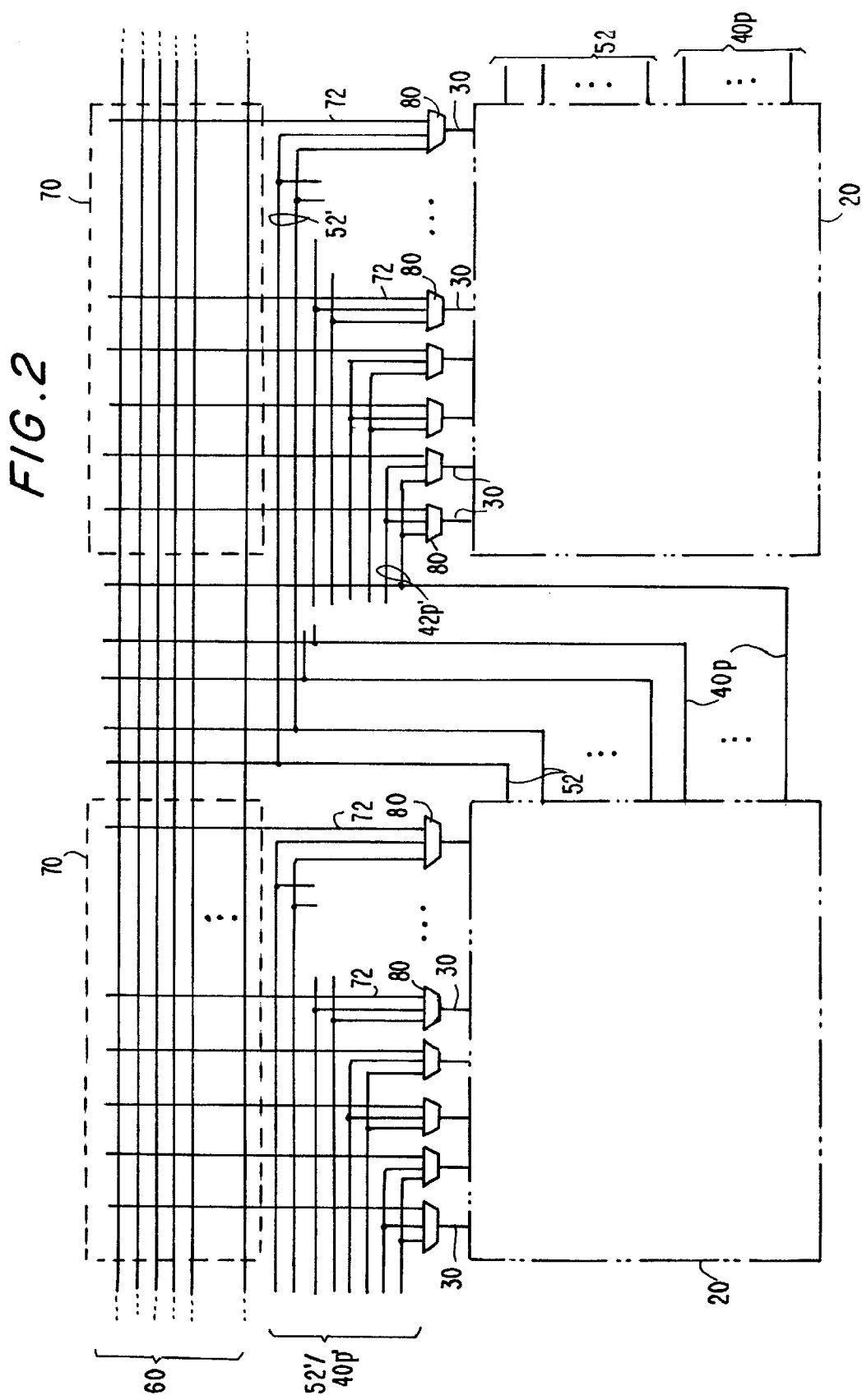
FIG. 2 is a simplified schematic block diagram of a representative portion of an alternative illustrative embodiment of a Pterm-based programmable logic device constructed in accordance with the invention.

FIG. 2 shows an alternative embodiment in which each direct connection 52' and 40p' has more than one way into the adjacent region 20. In the embodiment shown in FIG. 2, each PLC 80 has three inputs and is programmable to select one of those inputs as its output. One input to each PLC 80 is a region-feeding conductor 72. The other two inputs to each PLC 80 are two different ones of direct connections 52'/40p' from the adjacent region 20. This alternative increases routing flexibility for the direct connections, which may be especially helpful if PIAs 70 are less than fully populated. If desired, PLCs 80 may have even more inputs from more than two different ones of direct connections 52'/40p', thereby even further increasing routability of the direct connections into the associated region 20. The direct connection inputs to PLCs 80 may be mixed up more extensively than is suggested by the pattern shown in FIG. 2.

Figure 3:
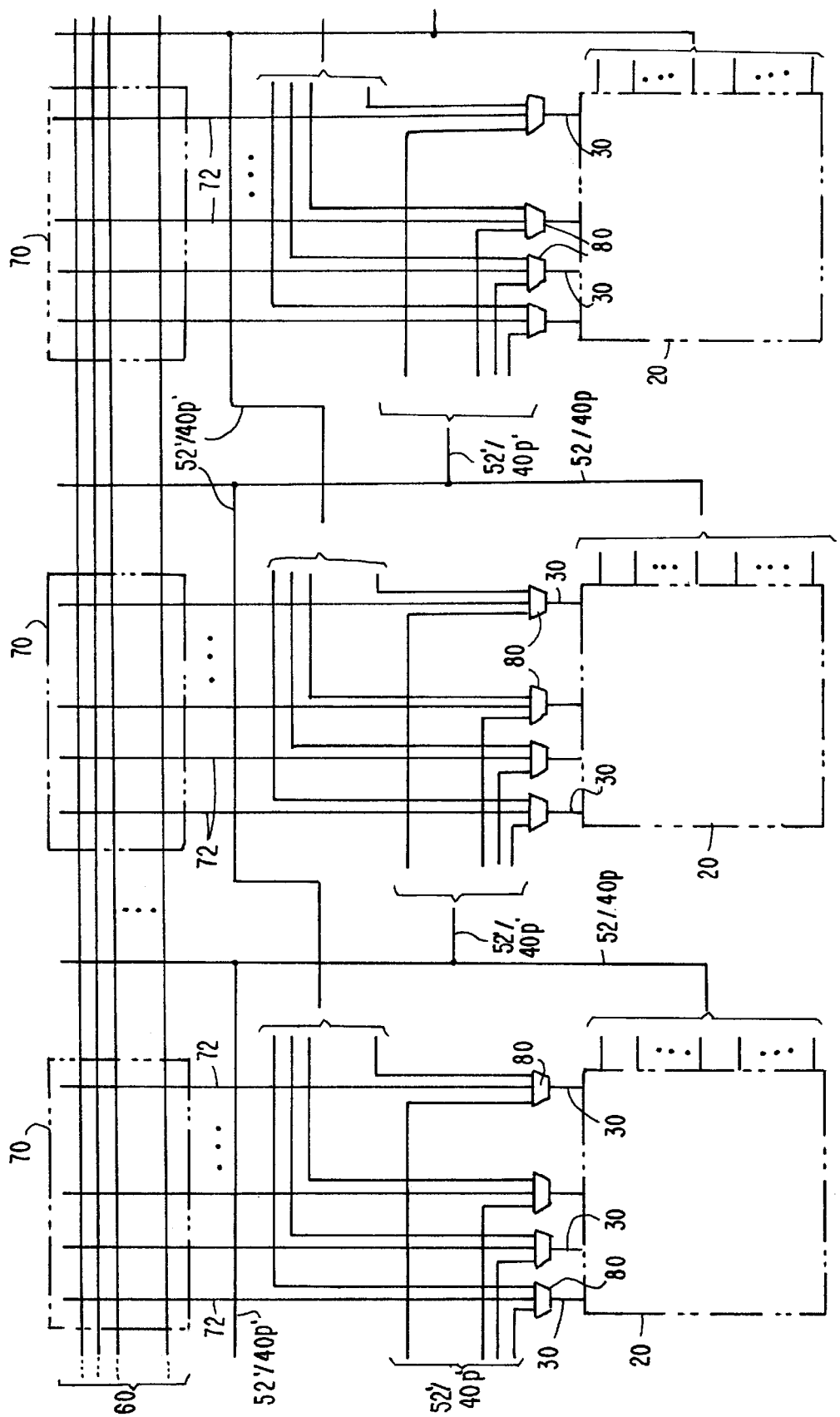
FIG. 3 is a simplified schematic block diagram of a representative portion of another alternative illustrative embodiment of a Pterm-based programmable logic device constructed in accordance with the invention.

FIG. 3 shows another alternative embodiment in which each region 20 has direct connections 52'/40p' of its outputs to two adjacent regions 20, one to the left and one to the right of the first region. This makes the architecture more symmetrical and makes the outputs of each region even more widely usable via direct connections 52'/40p'.

In the foregoing discussion of the embodiments shown in FIGS. 1–3 all outputs 52/40p of each region 20 are assumed to have direct connections 52'/40p' to one or more adjacent regions 20. It will be understood that some of these assumed direct connections 52'/40p' can be omitted if desired, so that only some of the outputs 52/40p of each region have direct connections to an adjacent region or regions. As another possibility, the direct connections 52'/40p' that are provided may be shared by two or more outputs 52/40p of the originating region 20. If this approach is taken, then each shared direct connection 52'/40p' may be provided with more than one way into the destination region or regions 20. These alternatives are illustrated by FIG. 4.

Figure 4:
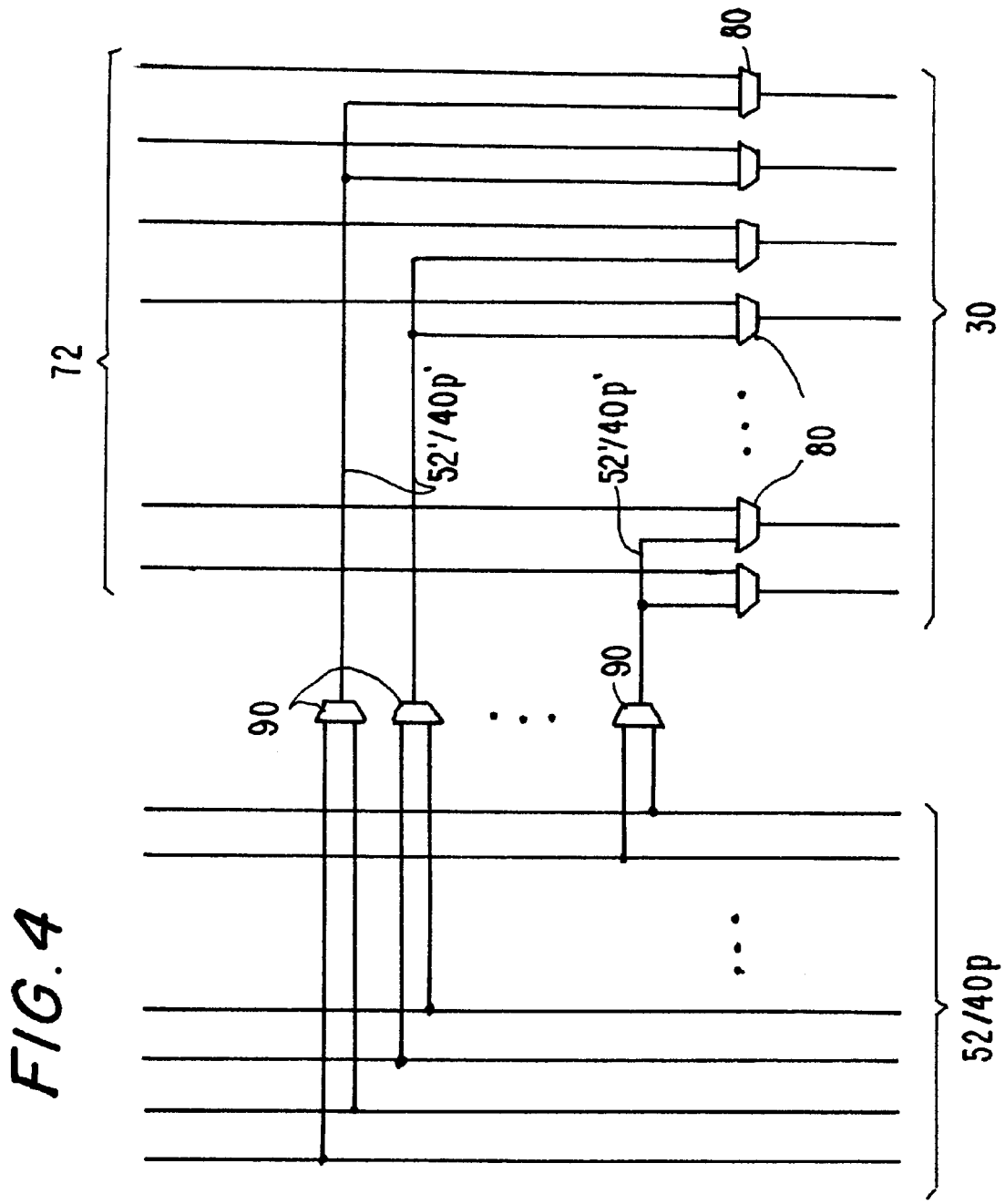
FIG. 4 is a simplified schematic block diagram illustrating possible modifications of any of the embodiments of FIGS. 1–3.

In the embodiment shown in FIG. 4 outputs 52/40p from a first region 20 are paired for purposes of connection to the inputs of PLCs 90. Each PLC 90 selects one of its two inputs for application to an associated direct connection conductor 52'/40p'. Each conductor 52'/40p' is connected to multiple ones of the PLCs 80 associated with an adjacent second region 20. The outputs 52/40p that are thus connected to PLCs 90 may be less than all of the outputs of the first region. Similarly, the inputs 30 of the second region that have associated PLCs 80 may be less than all of the inputs 30 of the second region. In other words, some of the inputs 30 of each region may connect directly to associated region-feeding conductors 72, with no associated PLC 80 being provided (see, for example, the extreme right-hand portion of FIG. 5 where this possibility is depicted). This last statement may also be true for embodiments shown in any of the above-described FIGS.

Figure 5:
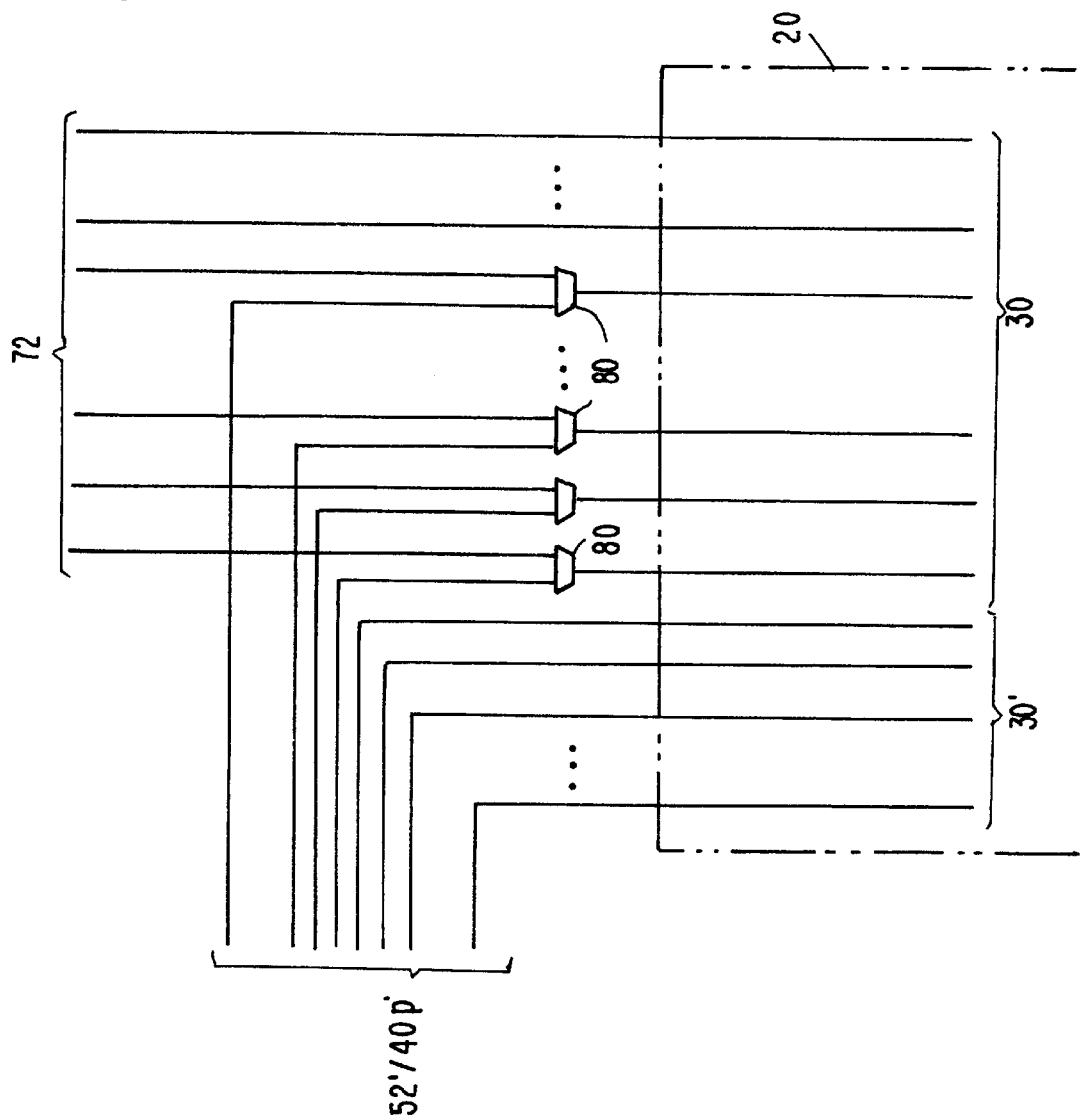
FIG. 5 is a simplified schematic block diagram illustrating other possible modifications of any of the embodiments of FIGS. 1–3.

The embodiments described thus far assume that the direct connections 52'/40p' from one or more adjacent regions 20 all share existing word lines 30 in the destination region 20. FIG. 5 shows an alternative embodiment in which some direct connections 52'/40p' share existing word lines 30 in the destination region 20, and some direct connections 52'/40p' feed additional word lines 30' in the destination region. For example, the direct connections that feed added word lines 30' may be expander Pterm direct connections 40p', while the macrocell output direct connections 52' share existing inputs 30. This allocation may be advantageous because expander Pterms do not need to be present in an AND array in both true and complement form. Thus each added line 30' can be a single line in the AND array, rather than separate true and complement lines as is typically provided for normal inputs 30.

Figure 6:
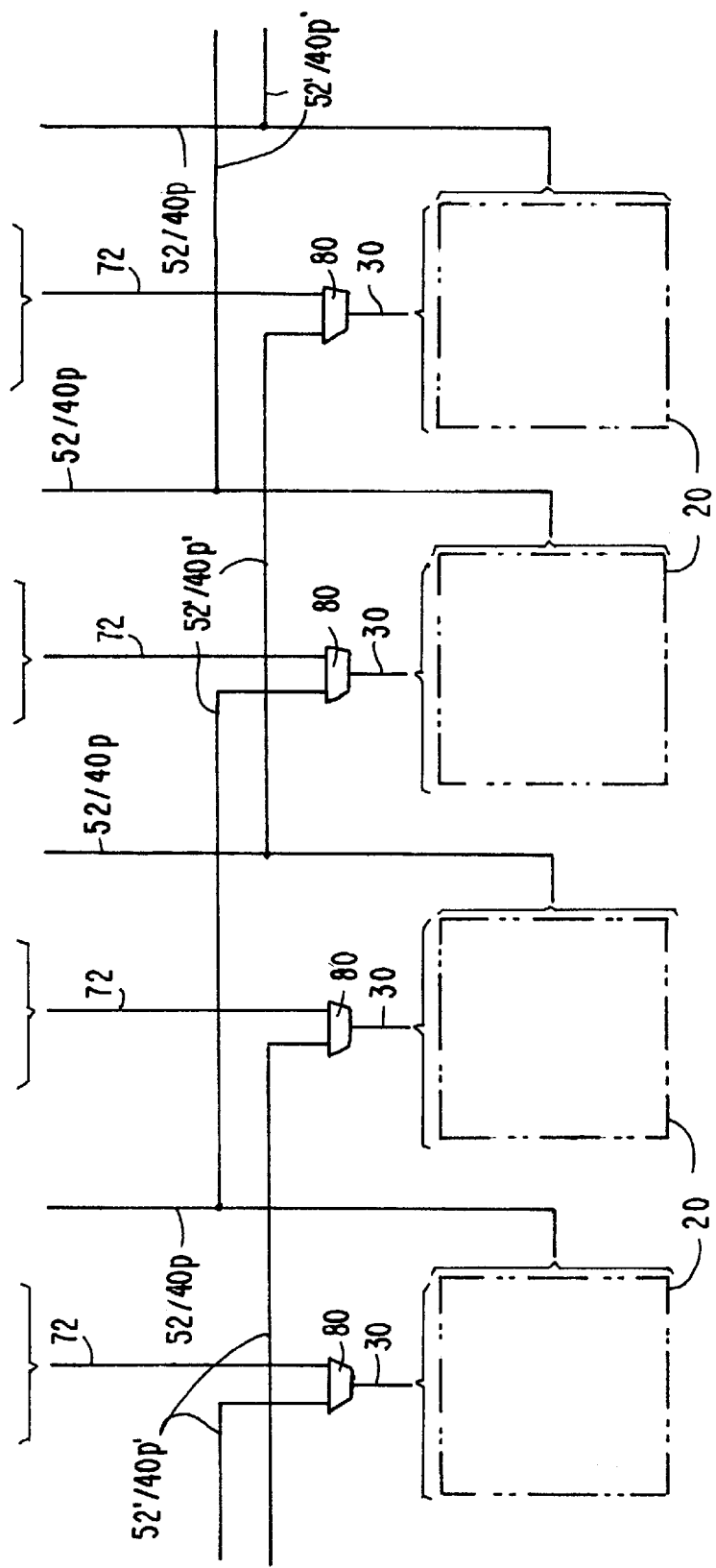
FIG. 6 is a schematic block diagram illustrating still other possible modifications of any of the embodiments of FIGS. 1–3.

The direct connections 52'/40p' between "adjacent" regions 20 need not be between immediately adjacent regions. For example, FIG. 6 shows an alternative embodiment in which direct connections 52'/40p' from each region 20 are made to the region that is immediately adjacent to the region that is immediately adjacent to the first region. Thus in the representative portion of a programmable logic device shown in FIG. 6 direct connections 52'/40p' extend from the left-most region 20 to the third from left-most region 20. Similarly, direct connections 52'/40p' extend from the next to left-most region 20 to the fourth from left-most region 20.

Figure 7:
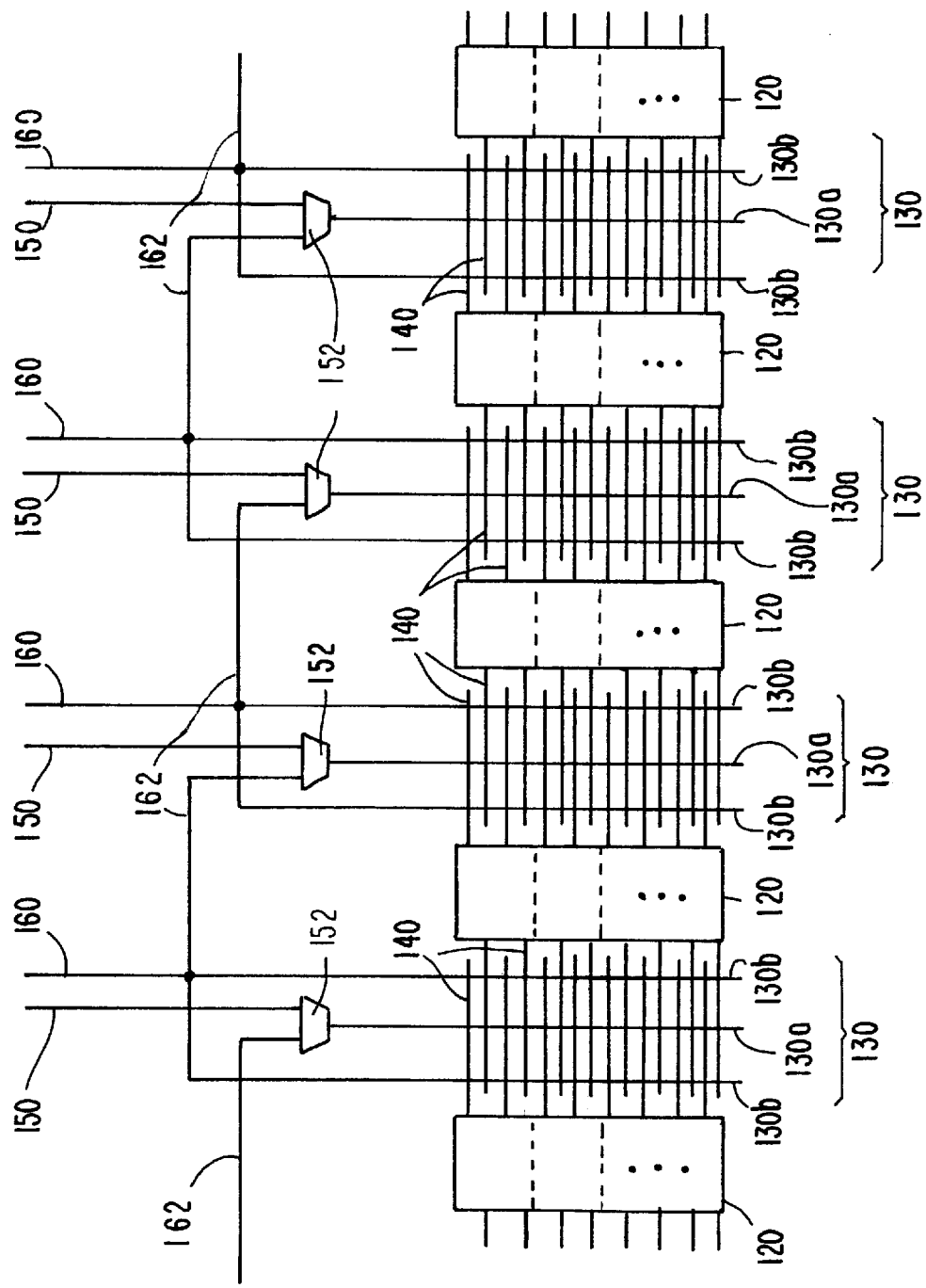
FIG. 7 is a schematic block diagram illustrating application of certain aspects of the invention to other types of programmable logic devices.

FIG. 7 illustrates application of certain aspects of the invention to programmable logic devices of the type which are the principal focus of the above-mentioned Cliff et al. reference. These are devices in which the basic logic is performed using look-up tables in programmable logic regions 120. In the particular devices shown in the Cliff et al. reference, horizontally adjacent logic regions 120 are interleaved with groups of local conductors 130. Each group of local conductors 130 includes conductors 130a for bringing signals to the adjacent regions 120, and conductors 130b for conveying signals between and from the adjacent regions 120. Conductors 140 are programmably connectable to the conductors 130 that they cross for conveying signals between those conductors 130 and the regions 120 to which they lead. Conductors 150 and PLCs 152 can be used to apply signals from sources like conductor network 60 in FIGS. 1–3 and 10 to conductors 130. Conductors 130b are also programmably connectable via leads 160 to destinations like conductor network 60 in FIGS. 1–3 and 10 to allow the outputs of regions 120 to be conveyed to relatively distant points on the device. At least some of the conductors 130b in each group of conductors 130 are also connected via leads 162 to inputs of PLCs 152 that serve at least one adjacent group of conductors 130. For example, at least some of conductors 130b in the group of conductors 130 that is interleaved between the two left-most regions 120 are connected to inputs of PLCs 152 that serve the conductors 130 that are interleaved between the second and third from left-most regions 120. These PLCs 152 can therefore select either the signals on the associated conductors 150 or the signals on the associated conductors 162 for application to the associated conductors 130a.

Without direct connection conductors 162 the architecture shown in FIG. 7 allows fairly direct connections between immediately adjacent regions 120. For example, an output signal can come out of the right-hand side of left-most region 120 and be applied to a conductor 130b between the two left-most regions 120. From that conductor 130b the signal can be conveyed into the next to left-most region 120 via a conductor 140 that crosses that conductor 130b and extends to the next to left-most region 120. For any longer-distance interconnections, however, the general-purpose interconnection network (like network 60 in FIGS. 1–3 and 10) must be used.

The addition of direct connections 162 and PLCs 152 to the basic structure described in the preceding paragraph greatly increases the number of direct connections that can be made without using the general interconnection network. Continuing with the example discussed in the preceding paragraph, elements 162 and 152 additionally allow direct connections from the left-most region 120 to the third from left-most region 120. A signal from the left-most region 120 is applied to a conductor 130b to the right. This conductor 130b is connected to a conductor 162 leading to a PLC 152 that is among the PLCs serving the conductors 130 between the second and third from left-most regions 120. This PLC 152 is used to apply the conductor 162 signal to the associated lead 130a. A conductor 140 leading to the right from that conductor 130a can be used to apply the signal to the third from left-most region 120.

Figure 8:
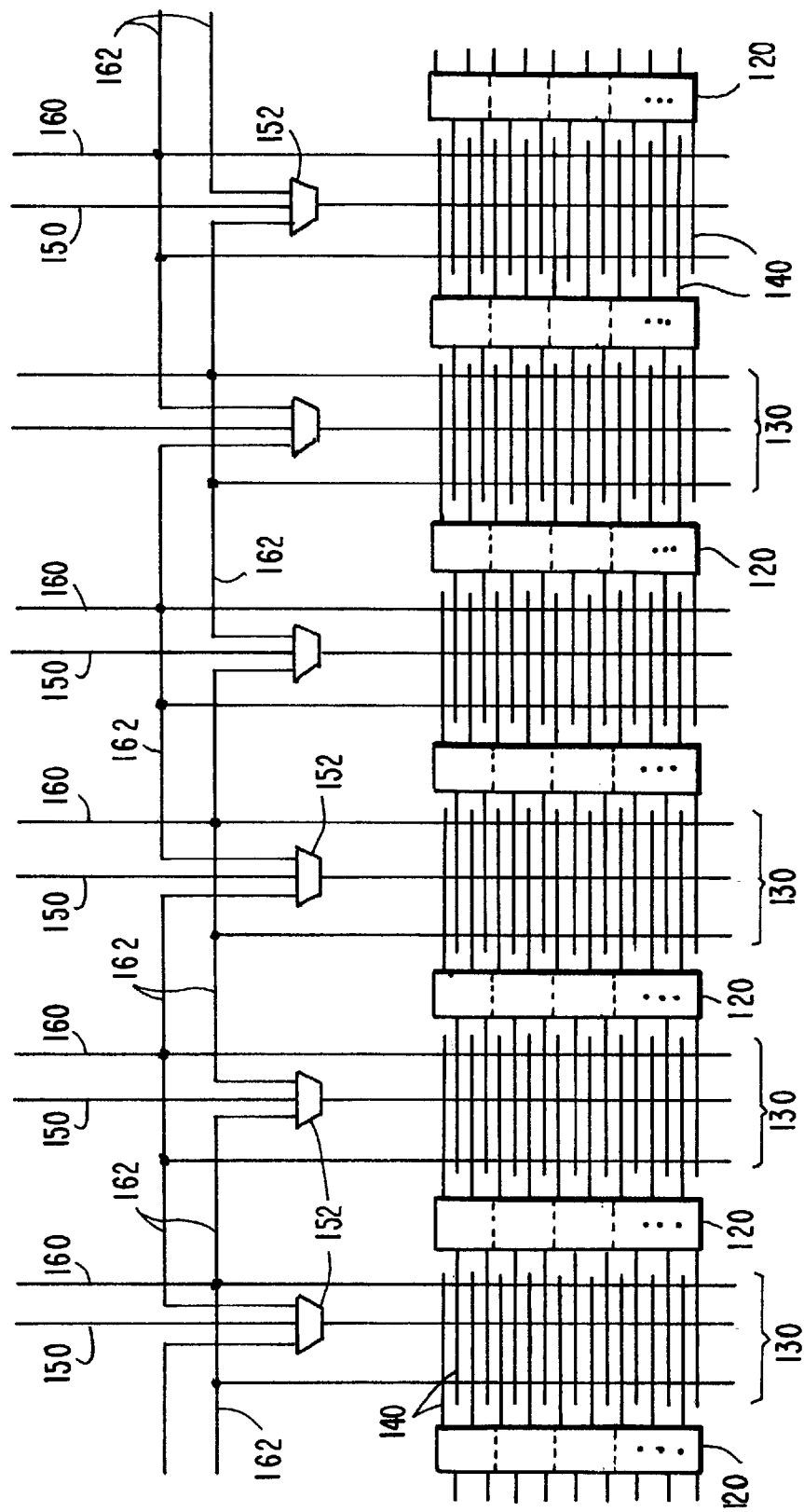
FIG. 8 is a view similar to FIG. 7 showing an alternative illustrative embodiment of the invention.
Figure 9:
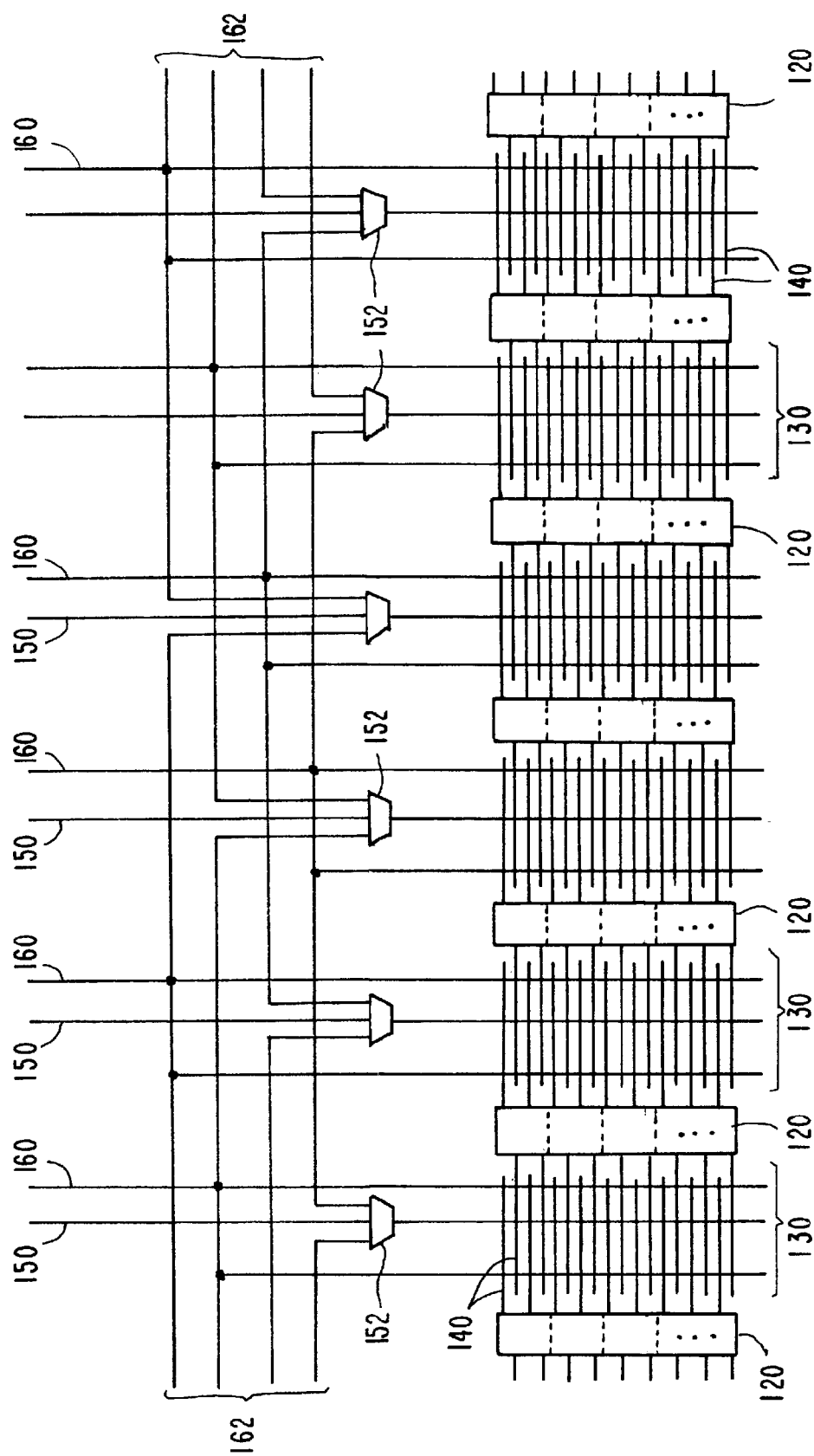
FIG. 9 is another view similar to FIG. 7 showing another alternative illustrative embodiment of the invention.

FIG. 8 shows a structure similar to FIG. 7, but with direct connection conductors 162 extending both left and right from each group of conductors 130. FIG. 9 shows a structure similar to FIG. 8 but with each group of direct connection conductors 162 extending farther to the left and right than in FIG. 8.

Figure 10:
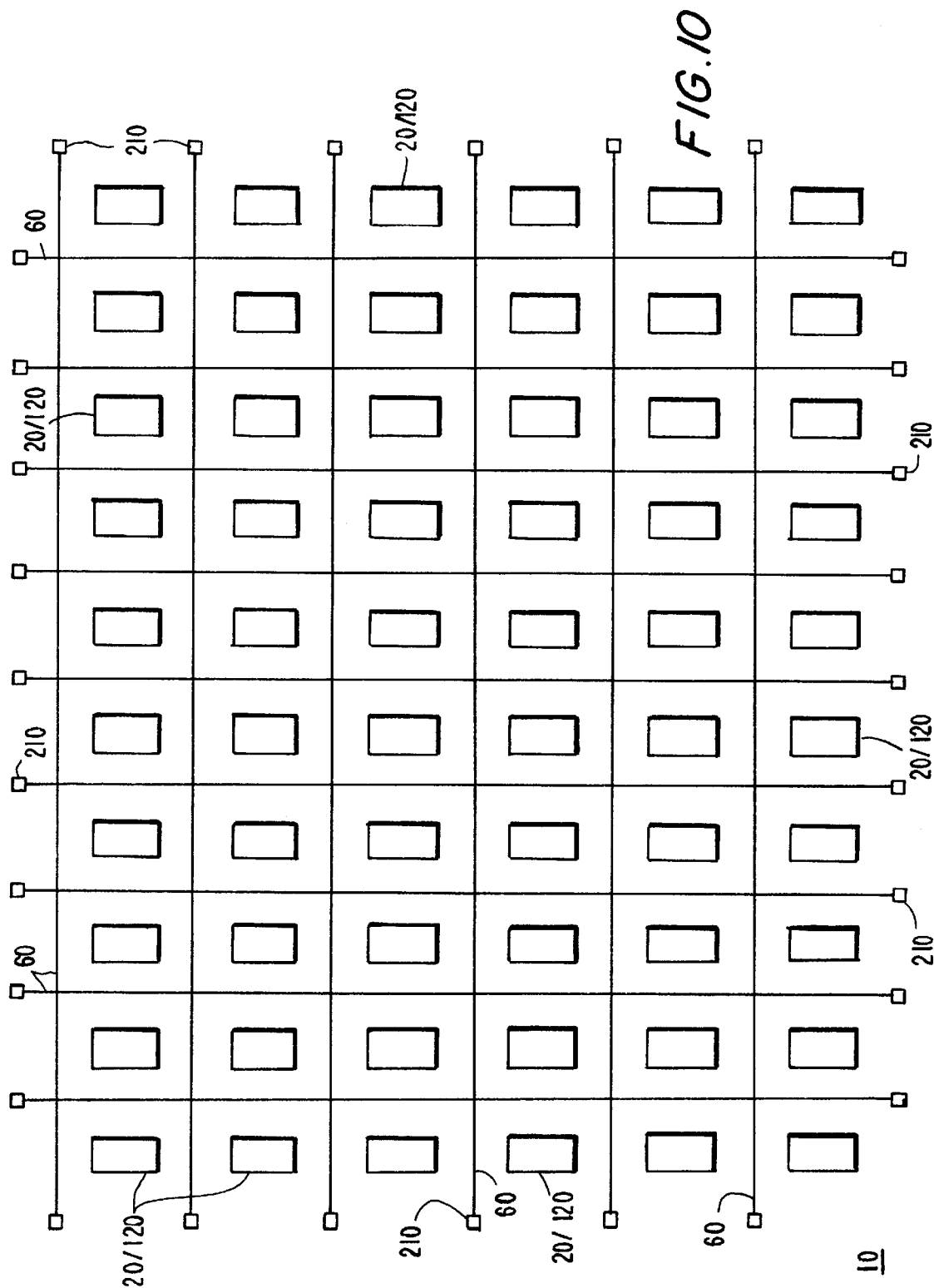
FIG. 10 is a simplified schematic block diagram showing more of an illustrative embodiment of a programmable logic device which can be constructed in accordance with the invention.

FIG. 10 shows more of a programmable logic device 10 which can be constructed as shown in any of the previously described FIGS. As shown in FIG. 10, device 10 has a plurality of intersecting rows and columns of regions 20/120 of programmable logic. Interconnection conductor network 60 includes horizontal conductors extending along the rows of regions 20/120 and vertical conductors extending along the columns of regions 20/120. Input/output pins 210 are connectable to conductors 60 adjacent their ends to allow device 10 to be connected to external circuitry. The numbers of rows and columns of regions 20/120 shown in FIG. 10 are only illustrative, and any desired numbers of rows and columns can be provided.

Figure 11:
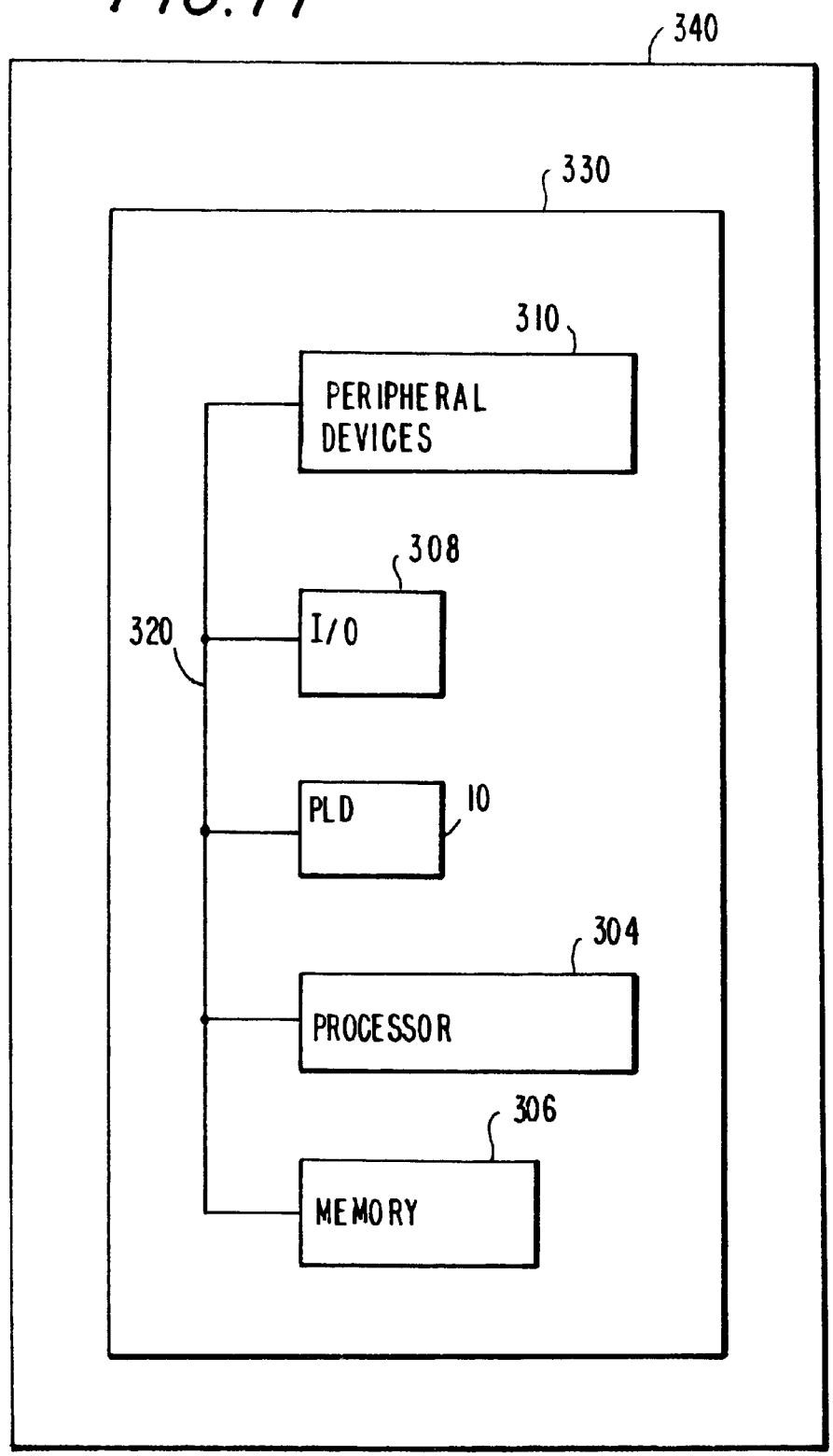
FIG. 11 is a simplified block diagram of an illustrative system employing a programmable logic device in accordance with the invention.

FIG. 11 illustrates a programmable logic device 10 of this invention in a data processing system 302. Data processing system 302 may include one or more of the following components: a processor 304; memory 306; I/O circuitry 308; and peripheral devices 310. These components are coupled together by a system bus 320 and are populated on a circuit board 330 which is contained in an end-user system 340.

System 302 can be used in a wide variety of applications, such as computer networking, data networking, instrumentation, video processing, digital signal processing, or any other application where the advantage of using programmable or reprogrammable logic is desirable. Programmable logic device 10 can be used to perform a variety of different logic functions. For example, programmable logic device 10 can be configured as a processor or controller that works in cooperation with processor 304. Programmable logic device 10 may also be used as an arbiter for arbitrating access to a shared resource in system 302. In yet another example, programmable logic device 10 can be configured as an interface between processor 304 and one of the other components in system 302. It should be noted that system 302 is only exemplary, and that the true scope and spirit of the invention should be indicated by the following claims.

The PLCs mentioned throughout this specification (which includes the appended claims) can be implemented in any of a wide variety of ways. For example, each PLC can be a relatively simple programmable connector such as a switch or a plurality of switches for connecting any one of several inputs to an output. Alternatively, each PLC can be a somewhat more complex element which is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. The components of PLCs can be controlled by various, programmable, function control elements ("FCEs"), which are not shown separately in the accompanying drawings. (With certain PLC implementations (e.g., fuses and metal optional links) separate FCE devices are not required.) FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferroelectric memories, fuses, antifuses, or the like. From the various examples mentioned above it will be seen that this invention is applicable both to one-time-only programmable and reprogrammable devices.

It will be understood that the foregoing is only illustrative of the principles of the invention and that various modifications can be made by those skilled in the art without departing from the scope and spirit of the invention. For example, the particular logic elements and groups of logic elements that have been shown for performing various functions are only illustrative, and other logically equivalent structures can be used instead if desired.

The invention claimed is:

1. A programmable logic device comprising:
   a plurality of logic regions, each of said logic regions having at least one input, a logic array programmable to produce a plurality of product-term signals, and a plurality of product-term-type logic elements, wherein each product-term-type logic element has at least one logic element output and is associated with a different subplurality of said product-term signals;

a plurality of conductors configured to conduct signals to said logic regions; and a first multiplexer having a plurality of first multiplexer inputs and a first multiplexer output, wherein:

said first multiplexer output is connected to said at least one input of a first one of said logic regions;

one of said first multiplexer inputs is connected to one of said plurality of conductors; and another of said first multiplexer inputs is connected to one of said at least one logic element output of a second one of said logic regions.

2. The programmable logic device of claim 1 wherein said first and second ones of said logic regions are physically adjacent one another.

3. The programmable logic device of claim 2 further comprising:

a third one of said logic regions physically adjacent said second one of said logic regions; and a second multiplexer having a plurality of second multiplexer inputs and a second multiplexer output, wherein:

said second multiplexer output is connected to said at least one input of said third one of said logic regions;

one of said second multiplexer inputs is connected to one of said plurality of conductors; and another of said second multiplexer inputs is connected to one of said at least one logic element output of said second one of said logic regions.

4. A digital processing system comprising:

processing circuitry;

memory circuitry coupled to the processing circuitry; and a programmable logic device as defined in claim 1 coupled to the processing circuitry and the memory circuitry.

5. A printed circuit board on which is mounted a programmable logic device as defined in claim 1.

6. The printed circuit board defined in claim 5 further comprising:

memory circuitry mounted on the printed circuit board and coupled to said programmable logic device.

7. The printed circuit board defined in claim 5 further comprising:

processing circuitry mounted on the printed circuit board and coupled to said programmable logic device.

8. A programmable logic device comprising a plurality of logic regions, each of said logic regions having at least one input and at least one product-term-type logic element, said at least one product-term-type logic element having at least one product-term output;

a plurality of conductors configured to conduct signals to said logic regions;

a first multiplexer having a plurality of first multiplexer inputs and a first multiplexer output, said first multiplexer output being connected to said at least one input of a first one of said logic regions, wherein one of said first multiplexer inputs is connected to one of said plurality of conductors, and wherein another of said first multiplexer inputs is connected to one of said at least one product-term output of a second one of said logic regions; and a plurality of additional multiplexers, each of said additional multiplexers having a plurality of inputs and an output, wherein:

each of a plurality of product term outputs of said second one of said logic regions is connected to at least one of said inputs of one of said additional multiplexers;

at least one of said inputs of each of said additional multiplexers is connected to one of said plurality of conductors; and said output of each of said additional multiplexers is connected to one of said at least one input of said first one of said logic regions.

9. The programmable logic device of claim 8 wherein at least one of said plurality of product term outputs of said second logic region is directly connected to said first logic region.

10. The programmable logic device of claim 8, wherein said plurality of product term outputs of said second one of said logic regions comprises every product term output of said second one of said logic regions.

11. The programmable logic device of claim 8 wherein each of said plurality of conductors is connected to at least one input of each of said additional multiplexers.

12. The programmable logic device of claim 8 wherein each input of each of said logic regions is connected to an output of one of said additional multiplexers.

13. The programmable logic device of claim 8, wherein at least one of said plurality of product term outputs of said second logic region is connected to inputs of a plurality of multiplexers among said first and additional multiplexers.

14. A digital processing system comprising:

processing circuitry;

memory circuitry coupled to said processing circuitry; and a programmable logic device as defined in claim 8 coupled to said processing circuitry and said memory circuitry.

15. A printed circuit board on which is mounted a programmable logic device as defined in claim 8.

16. The printed circuit board defined in claim 15 further comprising:

memory circuitry mounted on the printed circuit board and coupled to said programmable logic device.

17. The printed circuit board defined in claim 15 further comprising:

processing circuitry mounted on the printed circuit board and coupled to said programmable logic device.

* * * * *